United States Patent [19]
Pierce et al.

[11] Patent Number: 5,149,957
[45] Date of Patent: Sep. 22, 1992

[54] SEMICONDUCTOR-TO-METAL OPTICAL SWITCH FOR POWER LIMITATION IN THE INFRARED

[75] Inventors: Brian M. Pierce, Moreno Valley; George D. Lawrence, Los Angeles; David B. Chang, Tustin; Jonathan W. Arenberg, Santa Monica, all of Calif.

[73] Assignee: Hughes Aircraft Company, Los Angeles, Calif.

[21] Appl. No.: 748,170

[22] Filed: Aug. 21, 1991

[51] Int. Cl.$^5$ .............................................. H01J 40/14
[52] U.S. Cl. .................................. 250/211 R; 359/248
[58] Field of Search ............ 250/213 R, 211 J, 211 R; 357/30 E, 35 L, 16; 359/248, 206, 217

[56] References Cited

U.S. PATENT DOCUMENTS 3,344,280 9/1967 Martel .............................. 250/213 R
3,524,064 8/1970 Keyes ............................... 250/213 R

*Primary Examiner*—David C. Nelms
*Assistant Examiner*—Que T. Le
*Attorney, Agent, or Firm*—G. S. Grunebach; W. J. Streeter; W. K. Densov-Low

[57] ABSTRACT

A semiconductor-to-metal optical switch or device for power limitation in the infrared spectral region includes two thin semiconductor layers sandwiched between two transparent electrodes. An electrical voltage is applied across the two semiconductor layers to produce an active device for blocking incident light in the 8 to 12 $\mu$m spectral region. The material composition and thickness of the two semiconductor layers are such that enough photo-excited electrons are generated in the first semiconductor layer so that the second semiconductor layer undergoes a rapid semiconductor-to-metal transition at a predetermined light intensity. The semiconductor layers remain transparent below the predetermined light intensity and the second layer will become metal-like at a light intensity above a threshold level. Upon becoming metal-like, the second semiconductor layer will block the incident light. The first semiconductor layer can be made from a material such as mercury cadmium telluride and the second semiconductor layer can be made from a material such as germanium.

12 Claims, 1 Drawing Sheet

SEMICONDUCTOR-TO-METAL OPTICAL SWITCH FOR POWER LIMITATION IN THE INFRARED

BACKGROUND OF THE INVENTION

1. Field Of The Invention

The present invention relates to devices for protecting light sensitive objects and systems from the damaging effects of high intensity light and, more particularly, to an optical switch which is capable of rapid semiconductor-to-metal phase transition to provide frequency agile protection against pulsed laser light having pulsewidths ranging from under a nanosecond to microseconds and operating in the far infrared spectral region.

2. Description Of The Prior Art

There has been an increasing need for the development of effective devices for protecting light sensitive objects such as the eyes of military personnel and the detector elements of electro-optical (EO) equipment and systems from the damaging effects of laser radiation, particularly in military applications where there has been increased deployment of lasers as offensive weapons for disabling personnel and systems that rely on EO equipment. Military applications of lasers in the visible (400 to 700 nm) and near-infrared (700 to 1200 nm) spectral region are already well known and numerous protective devices to counter these laser threats have been proposed and developed. In these applications, protective eyewear has been developed for the protection of the eyes of military personnel. Military use of lasers has now advanced into the far infrared spectral region (8 to 12 $\mu$m) for which there are presently few, if any, viable protective measures.

In order to be effective, the protective device must allow the object that it protects, whether it be a detector or sensor of an EO system or a person's eyes, to operate over a broad range of wavelengths until irradiated with a light at an intensity above the level at which damage to the object occurs. It is also usually beneficial if the protective device remains transparent when there is no laser threat to allow the protected object to operate unimpaired. More importantly, the protective device must have a rapid response time after being irradiated above the damage threshold to effectively attenuate the incidental light. In many applications, a response time of a few nanoseconds is necessary to prevent temporary or permanent damage to the protected object.

While numerous devices have been developed to protect against high intensity light generated by lasers or a nuclear flash, most lack the ability to remain transparent over a broad wavelength range and still be capable of attenuating high intensity light within a few nanoseconds. Some devices are capable of performing one of the above-mentioned functions but are generally inadequate in performing other necessary functions.

In the case of laser light, particularly frequency agile pulsed laser light in the 8 to 12 $\mu$m spectral region with pulse-widths ranging from nanoseconds to microseconds, there are few, if any, viable counter measures that are now available. Potential devices that can possibly be used to block this particular type of laser light with a response time in the order of nanoseconds have experienced problems with thermal biasing or require materials or thin films that are difficult to obtain or manufacture.

It would be advantageous to have a device or switch that provides adequate protection against pulsed laser light in the far infrared spectral region (8 to 12 $\mu$m) and that will remain transparent to incident light having an intensity below the damage threshold of the protected object It would be additionally advantageous for the device to have a response period of a few nanoseconds in order to protect against damage from short pulses of laser light having pulsewidths from nanoseconds to microseconds. Such a device would have numerous applications especially if it can be easily manufactured in a relatively simple lightweight structure.

SUMMARY OF THE INVENTION

Briefly, and in general terms, the present invention provides an innovative approach for the protection of light sensitive objects against pulsed laser light having pulsewidths that range from under a nanosecond to microseconds and operate in the infrared spectral region. The invention is capable of remaining transparent over a broad wavelength range and is capable of becoming opaque or metal-like within a few nanoseconds after being struck by incident light having an intensity that exceeds a predetermined threshold intensity.

More specifically, the present invention is primarily made from two different semiconductor layers that are "sandwiched" between two transparent electrodes. One semiconductor layer is made from a narrow band-gap semiconductor material and the other layer is made from a wide band-gap semiconductor material. These layers of transparent electrodes and semiconductors are connected to a source for applying an electrical potential between the two electrodes. The properties and dimensions of the semiconductor layers and the magnitude of the applied voltages are determined so that photo-excited electrons generated in the narrow band-gap layer are multiplied by an avalanche impact ionization gain mechanism in the wide band-gap semiconductor layer. The multiplied electrons in the wide band gap layer are intended to attain a density that makes this layer undergo a rapid semiconductor-to-metal transition when struck with light above an intensity threshold at which damage can occur to the protected object. The wide bandgap semiconductor layer acts to attenuate the incident light once it becomes metal-like. The optical switch of the present invention is designed to be transparent below the damage threshold of the protected object to allow the object to operate unimpaired until a laser threat is detected.

The present invention is specifically useful for attenuating laser light in the infrared spectral region, particularly frequency agile pulsed laser light in the 8 to 12 $\mu$m spectral region with pulses ranging from nanoseconds to microseconds. The present invention is particularly attractive because there are currently few, if any, viable counter measures to this type of laser threat.

The present invention can be incorporated into a number of different embodiments for protecting objects that can be damaged or disabled when subjected to certain laser light in the infrared region. For example, the invention can be constructed in sheets which allows it to be built into a protective housing that contains the object to be protected against the laser threat. Alternatively, since the layers of semiconductor materials and electrodes can be made extremely thin, the present invention can be built directly into the EO system if desired.

BRIEF DESCRIPTION OF THE DRAWINGS

The foregoing aspects and other features of the present invention will become more apparent from the following detailed description of the preferred embodiments, taken in conjunction with the accompanying drawings wherein.

DETAILED DESCRIPTION OF THE PREFERRED EMBODIMENTS

The present invention is directed to a semiconductor-to-metal switch or device for effectively blocking high intensity light in the infrared spectral region. The switch is designed to remain transparent over a broad range of wavelengths and is capable of rapidly becoming opaque or metal-like via rapid semiconductor-to-metal transition to attenuate incident light above a certain threshold intensity.

Figure 1:
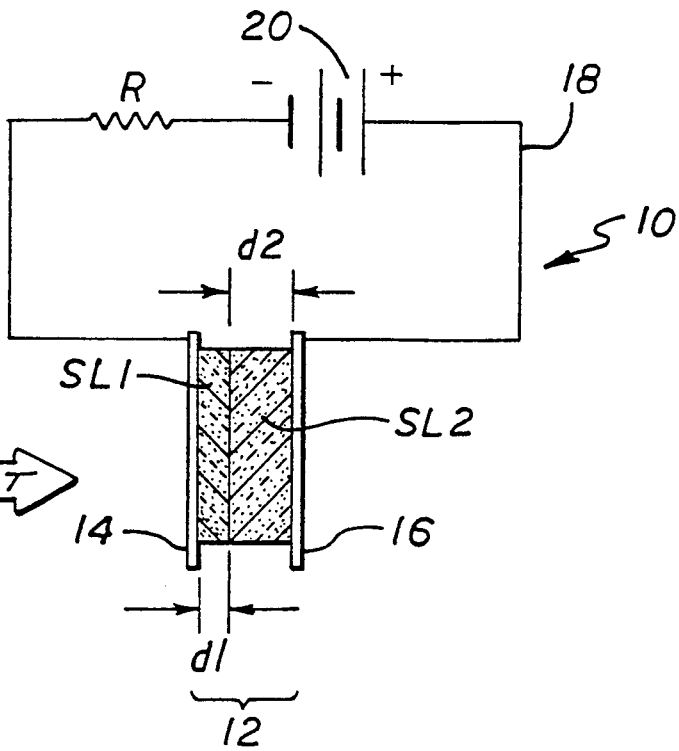
FIG. 1 is a cross-sectional schematic diagram illustrating the electrical circuit and layers of electrodes and semiconductors used in accordance with the present invention.

FIG. 1 shows one particular embodiment of a semiconductor-to-metal switch (10) made in accordance with the present invention. A wafer (12) has two semiconductor layers SL1 and SL2 sandwiched between two transparent electrodes (14) and (16). The wafer (12) is connected in a series electrical circuit (18) including a DC voltage source (20) and a resistor R. The DC voltage of source can be, for example, a battery, a charged capacitor, a pulse-forming network, or any other suitable voltage source.

The semiconductor layer SL1 has a thickness $d_1$ and may be fabricated from a semiconductor material having a narrow band-gap energy ($E_{G1}$) which must be less than the lowest energy photon that could disable, damage or otherwise threaten the object that is being protected by the switch. For example, in order to counter pulsed laser light in the 8 to 12 $\mu$m spectral region, this narrow band gap layer SL1 must have a band-gap energy ($E_{G1}$) that is less than the band gap energy of a 12 $\mu$m photon which is approximately 0.103 eV.

The other semiconductor layer SL2 also has a certain thickness $d_2$ and is fabricated from a semiconductor material that has a wide band-gap energy ($E_{G2}$) The band-gap energy of this layer SL2 should be greater than the energy of the highest energy photon that needs to be transmitted under normal circumstances to the object protected by the switch. In the case of laser light in the 8 to 12 $\mu$m optical region, an 8 $\mu$m photon would have an energy of about 0.155 eV. Therefore, the band-gap energy of semiconductor layer SL2 should be greater than about 0.155 eV.

The operation of the semiconductor-to-metal switch (10) occurs when laser light above the selected threshold strikes the semiconductor layer SL1. When struck by this light, the layer SL1 generates conducting electrons through the absorption of photons. These electrons are then injected into the second semiconductor layer SL2. Layer SL2 is designed to provide an avalanche impact ionization gain mechanism that increases the number density of conducting electrons. This layer of semiconductor material undergoes the semiconductor-to-metal phase transition if the number density that results from light absorption at intensities above the threshold in that layer is sufficiently high. Once layer SL2 becomes metal-like, it should effectively attenuate or reflect the incident light and protect the light sensitive object that would be placed behind the switch. Below the damage threshold, the semiconductor-to-metal switch would be transparent.

In order to achieve the semiconductor-to-metal transition, the semiconductor layer SL1 is subject to additional constraints relating to its dimensions and the material that must be utilized. Along with the constraint on the band-gap energy mentioned above, the recombination time of the excited electrons in the semiconductor layer SL1 must be greater than the time needed to sweep these electrons into the semiconductor layer SL2. Also, the thickness $d_1$ of the semiconductor layer SL1 must be small enough to allow this layer to be transparent below the damage threshold, yet large enough to absorb a critical number of photons above the damage threshold. Consequently, the thickness $d_1$ of layer SL1 should be approximately equal to the absorption length for the semiconductor comprising layer SL1.

The voltage applied across the wafer (12) must also be large enough so that the electrons in the conduction band of layer SL1 experience no significant barrier for injection into the conduction band of layer SL2.

The layer SL2 is intended to make possible an increase in the number density of conducting electrons transferred to it from layer SL1, so that a critical number density of conducting electrons is obtained that results in the formation of a metallic region of skin depth $\delta$ that is less than the thickness $d_2$ of layer SL2. This metallic region will then reflect the laser light incident on the device and thus protect the object that is placed behind the switch.

The gain across layer SL2 results from the interaction of the electric field, E, and the conducting electrons in layer SL2. This interaction results in an increase of the kinetic energy of the conducting electrons so that when the excited electrons collide with valence electrons, more conducting electrons are produced. This impact ionization of valence electrons is identical to the amplification process in an avalanche photodiode.

Semiconductor layer SL2 is also subjected to constraints on its material and dimensions. As mentioned above, it is desirable that the band gap energy of the semiconductor layer SL2 should be greater than that of the energy of the highest energy photons that need to be transmitted under normal circumstances to the object that is being protected by the switch. When this condition is satisfied, the in-coming photons of interest do not directly create conducting electrons in layer SL2 by radiation absorption in layer SL2. This property makes it possible for the thickness $d_2$ of layer SL2 to be longer than the absorption length for the semiconductor material. Additionally, the relaxation time of the conducting electrons in layer SL2 must be greater than both the time required to form the metallic region of skin depth $\delta$ and the laser pulsewidth. Further, the band-gap energy $E_{G2}$, the mobility, $\mu_e$, and the effective mass, $m_e$, of the conducting electrons in layer SL2 must be such that an adequate gain can be obtained for reasonable values of $d_2$ and the magnitude of the electron field E that is applied to the wafer. Additionally, the thickness $d_2$ of layer SL2 should be large enough so that the metallic region of skin depth, δ, can be formed within layer SL2, yet is small enough so that the response time of the system is on the order of nanoseconds. The value of the thickness $d_2$ should range from tens to hundreds of microns.

The expected operation of the semiconductor-to-metal switch may be summarized as follows:

1. Above the laser damage threshold of the detector, the light intensity generates a number of conducting electrons per unit area, N, in layer SL1.
2. The electric field, E, causes the conducting electrons to be transferred from layer SL1 to layer SL2.
3. The electric field, E, increases the kinetic energy of the conducting electrons in layer SL2 so that when they collide with valence electrons, more conducting electrons are produced, i.e., avalanche impact ionization takes place.
4. If the gain across layer SL2 is G, then the number of conducting electrons per unit area in layer SL2 is GN.
5. The voltage applied to the wafer and the thickness of layer SL2 are set so that a conducting electron density of GN causes the formation of a metallic region of skin depth δ within layer SL2 which is less than the thickness $d_2$ of layer SL2.
6. The metallic region attenuates the laser light incident on the wafer of semiconductor materials and transparent electrodes.
7. The time constant for the formation of the metallic region is determined by the transit time of the electrons, the collision frequency, and the probability for impact ionization when the relaxation time is greater than the transit time.
8. The time constant for the existence of the metallic region or the critical number density of conducting electrons is determined by the resistance in the circuit, the capacity of the semiconductor sandwich, and the recombination time of the electrons.

The materials that make up the semiconductor layers SL1 and SL2 may vary. The purpose of semiconductor layer SL1 is to inject a critical number of photo-generated electrons into the semiconductor layer SL2 at light intensities above the damage threshold while maintaining maximum transmittance at light levels below that causing damage. This layer SL1 may, for example, be an amorphous film which is easy to deposit and has a band gap similar to that of monocrystalline material. Also, the absorption length of the amorphous material is shorter than that of the monocrystalline material. This means that the amorphous material will be thinner than monocrystalline material for the same transmittance. Further, the recombination times for the amorphous semiconductor material are shorter than for the monocrystalline material, requiring a higher bias to draw conducting electrons into layer SL2. For use in the infrared spectrum, one material that could be used is mercury cadmium telluride (HgCdTe). Mercury cadmium telluride is especially useful since it has a tunable band gap through variation of the Hg-Cd stoichiometry.

The structure of layer SL2 should be either monocrystalline or polycrystalline principally because the impact ionization gain mechanism for increasing the conducting electron number density requires high mobility and long relaxation times. These properties are typical of monocrystalline or polycrystalline semiconductors. Germanium possesses these properties and would be used to form the semiconductor layer SL2. Germanium is chosen since the impact ionization mechanism has been well studied in germanium and germanium is a common material in long-wave thermal imaging systems. The transparent electrodes may be made from a transparent material such as indium tin oxide.

The wafer (12) may be fabricated through a sequence of thin-film depositing. Photo-chemical vapor deposition, standard RF-magnetron sputtering techniques or other suitable depositing techniques can be utilized to produce the thin films necessary to produce the present invention.

The first transparent electrode can be formed by depositing a thin layer of indium-tin-oxide on to a transparent surface such as glass or any suitable material transparent at the wavelengths of interest. An amorphous film of mercury cadmium telluride (HgCdTe) can then be deposited on the first transparent electrode to form the layer SL1. The next layer SL2 of germanium would then be deposited on the mercury cadmium telluride layer. The second transparent electrode, which would be similar to the first electrode, can then be deposited on the germanium layer.

It should be appreciated that the layers of semiconductor materials and transparent electrodes can be created in the opposite order and by utilizing other techniques and steps without departing from the spirit and scope of the present invention.

Figure 2:
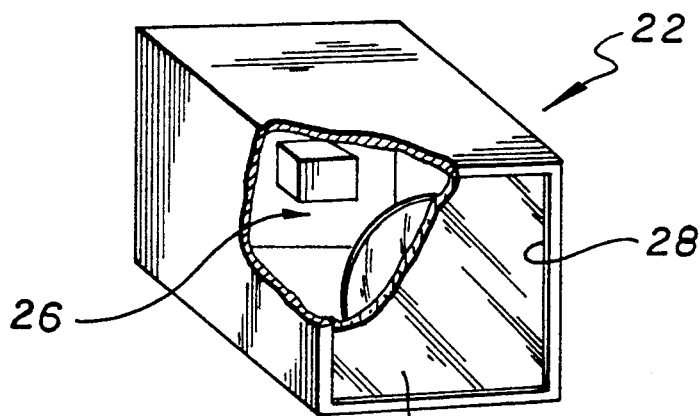
FIG. 2 is a perspective view of a protective housing assembly (with portions partially removed) incorporating the semiconductor-to-metal switch made in accordance with the present invention.
Figure 3:
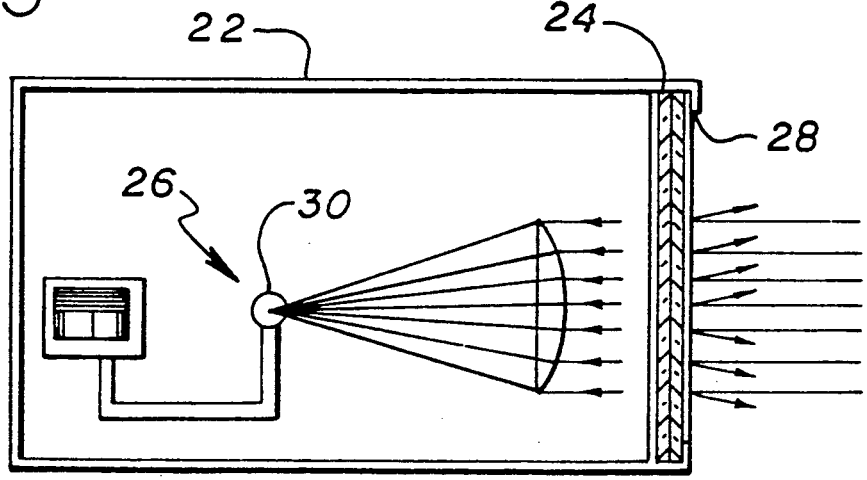
FIG. 3 is a sectional view of the housing assembly of FIG. 2.

FIGS. 2 and 3 illustrate a protective housing (22) which incorporates a semiconductor-to-metal optical switch (24) made in accordance with the present invention for protecting a light sensitive object (26) (shown schematically in FIGS. 2 and 3 for simplicity). The protective housing (22) includes an open end (28) in which the optical switch (24) is placed. The housing (22) contains a sensor or detector (30). The housing holds the semiconductor-to-metal optical switch (24) within the open end (28) to protect the detector (30) from adverse laser light.

The protective housing operates such that when the incident light intensity is below the damage threshold of the detector, the optical switch remains transparent to allow the detector (30) to function normally. Once the incident light intensity exceeds the damage threshold of the detector, the optical switch becomes conductive and turns opaque or metal-like. The optical switch should remain metal-like until the incident light intensity falls below the damage threshold.

In FIG. 3, arrows illustrate how the optical switch will attenuate incident light which strikes the optical switch. Once the switch becomes metal-like, the potentially damaging or disabling light cannot reach the detector. After the intensity of the threatening light has subsided, the switch will again become transparent so that the detector can again operate normally and unimpaired.

It should be appreciated that the protective housing shown in FIGS. 2 and 3 is representative of numerous devices that can be utilized with the present invention in order to provide protection to sensitive objects from damaging laser light. Other devices can of course be developed that incorporate the present invention. Also, the optical switch may be formed directly on a lens used in EO equipment and systems.

It should be understood that the above-described embodiments are merely illustrative of embodiments that incorporate the present invention and that other arrangements may be devised by persons skilled in the art without departing from the spirit and scope of the invention.

We claim:

1. A device for protecting a light sensitive object against high intensity light in the middle infrared spectral region comprising:

first and second transparent electrodes;

first and second semiconductor layers disposed between said first and second electrodes;

said first semiconductor layer comprising a first semiconductor material made from mercury cadium telluride and said second semiconductor layer comprising a second semiconductor material made from germanium;

means for applying an electric field to said first and second electrodes;

said first semiconductor layer being transparent to incident light and comprising means for generating conducting electrons by the absorption of photons, the resulting electrons being injected into said second semiconductor layer by said electric field;

said second semiconductor layer being transparent to incident light below a predetermined intensity and comprising means for increasing the number of conducting electrons injected from said first semiconductor layer due to the interaction of said electric field and said conducting electrons, whereby for incident light intensities above the predetermined intensity, sufficient conducting electrons are formed in said second semiconductor layer to cause a semiconductor-to-metal transition of material in said second semiconductor layer to block the incident light.

2. The device as defined in claim 1 wherein said first and second electrodes and said first and second semiconductor layers are substantially planar.

3. The device as defined in claim 1 wherein said first semiconductor layer has a thickness approximately equal to one absorption length for said first semiconductor material.

4. The device as defined in claim 1 wherein said second semiconductor layer has a thickness that is greater than an absorption length for said second semiconductor material.

5. The device as defined in claim 4 wherein said first semiconductor layer has a band gap energy that is less than the lowest energy photon of the incident light that will cause damage to the object and said second semiconductor material has a band gap energy that is greater than the energy of the highest energy photon of the incident light that needs to be transmitted under normal circumstances to the object.

6. The device as defined in claim 5 wherein said device provides protection against pulsed laser light in the 8 to 12 $\mu$m infrared spectral region and said first semiconductor layer has a band gap that is lower than about 0.103 eV and said second semiconductor layer has a band gap that is greater than about 0.155 eV.

7. The device as defined in claim 6 wherein the relaxation time of conducting electrons in said second semiconductor layer is greater than the laser pulsewidth and the time required to form the semiconductor-to-metal transition.

8. A device for protecting a light sensitive object from high intensity light in the middle infrared spectral region comprising;

first and second semiconductor layers disposed between first and second transparent electrodes;

said first semiconductor layer comprising a layer of a first semiconductor material having a band gap less than about 0.103 eV and wherein the recombination time of the excited electrons in said first semiconductor layer is greater than the time needed to sweep these electrons into said second semiconductor layer, the thickness of said first semiconductor layer being approximately equal to one absorption length of the first semiconductor material;

said second semiconductor layer comprising a second semiconductor material having a band gap energy greater than about 0.155 eV, the thickness of said second semiconductor layer being large enough to permit a metal region to form on said second layer; and means for applying an electric field across said first and second conducting layers such that electrons in the conduction band of said first semiconductor layer experience no significant barrier for injection into the conduction band of said second semiconductor layer.

9. The device as defined in claim 8 wherein the first semiconductor material is mercury cadium telluride.

10. The device as defined in claim 9 wherein the second semiconductor material is germanium.

11. The device as defined in claim 10 wherein said first and second electrodes and said first and second semiconductor layers are substantially planar.

12. The device as defined in claim 8 wherein said device provides protection against pulsed laser light in the 8 to 12 $\mu$m infrared spectral region and the relaxation time of conducting electrons in said second semiconductor layer is greater than the laser pulsewidth and the time required to form the metal region on said second semiconductor layer.

* * * * *